United States Patent [19]

Mizzi et al.

[11] Patent Number: 4,723,195
[45] Date of Patent: Feb. 2, 1988

[54] ASSEMBLY INCLUDING A MODULAR ELECTRICAL CIRCUIT AND CONNECTOR

[75] Inventors: Francois Mizzi, La Selle Saint Cloud, France; Jean-Jacques Grimaud, Palo Alto, Calif.

[73] Assignee: RDI Limited Partnership, Wilmington, Del.

[21] Appl. No.: 847,256

[22] Filed: Apr. 2, 1986

[30] Foreign Application Priority Data

Apr. 3, 1985 [CH] Switzerland ............ 1440/85

[51] Int. Cl.⁴ ............................................. H05K 7/00
[52] U.S. Cl. ............................. 361/393; 200/153 LA; 200/292
[58] Field of Search ............ 361/393, 392, 394, 395, 361/396; 364/709, 710, 706; 340/825.34, 825.35; 200/46, 153 LA, 292, 61, 58

[56] References Cited

U.S. PATENT DOCUMENTS

| | | | |
|---|---|---|---|
| 3,082,398 | 3/1963 | Valach | 339/176 |
| 3,430,186 | 2/1969 | Herb | 339/74 |
| 3,491,328 | 1/1970 | Geis | 339/66 |
| 3,849,610 | 11/1974 | Lockard et al. | 200/153 LA |
| 4,080,027 | 3/1978 | Benasutti | 339/17 F |
| 4,172,626 | 10/1979 | Olsson | 339/17 F |
| 4,181,386 | 1/1970 | Olsson | 339/17 F |
| 4,252,389 | 2/1981 | Olsson | 339/17 F |
| 4,259,668 | 3/1981 | Nishimura et al. | 364/710 |
| 4,331,372 | 5/1982 | Bright | 339/74 R |
| 4,545,023 | 10/1985 | Mizzi | 361/393 |

FOREIGN PATENT DOCUMENTS 0006725 1/1980 European Pat. Off. .
0121467 10/1984 European Pat. Off. .
887101 1/1962 United Kingdom .

Primary Examiner—A. D. Pellinen
Assistant Examiner—Morris Ginsburg
Attorney, Agent, or Firm—Cushman, Darby & Cushman

[57] ABSTRACT

The assembly comprises a casing and a PC-Board in sheet form arranged therein, having a comb-spring and projecting freely into a recess of the wall of the casing. The lower face of the PC-board is furnished with a set of conductive pathways leading to microchips to be connected to an independent electric system by bending the PC-board sheet so as to make contact with a second set of homologous conductive pathways belonging to said system. This bending is obtained by displacing a shoe pushing a cylindrical bar freely engaged in a slot of the wall of the casing in communication with the recess, the bar lying on the structure formed by the combining and the PC-board sheet.

The electrical contact between both sets of conductive pathways can be interrupted by moving the shoe axially in a first direction corresponding to the bending of the PC-board sheet; a motion of the shoe in a second opposite direction re-establishes the electrical contact conditions of both sets of pathways.

7 Claims, 13 Drawing Figures

ASSEMBLY INCLUDING A MODULAR ELECTRICAL CIRCUIT AND CONNECTOR

As is known, electronic installations and apparatus are made up nowadays almost completely by the assembly of a plurality of immobile but interchangeable cards, generally formed of a printed circuit giving support to one or more electronic circuits, for example integrated circuits branching off therefrom, and indeed coupled together by means of such a circuit. In the interior of a said installation or apparatus, these cards are coupled together by way of an array of bus bars to which they are electrically connected by systems of connectors which are both numerous and various. These systems are generally fairly complex in their makeup, and they make it practically impossible for any unskilled user to attempt replacement of one card by another unassisted. Furthermore, replacement of that kind cannot generally be done without access gained to the heart or centre of the installation or apparatus in question.

The arrival of computer games and home mini-computers has led to their designers providing for user involvement in substituting certain cards carrying given circuits, relating for example to information programmes, without having to work inside the casing of the apparatus nor to use special tools. This is the reason why these cards have been disposed beneath a rigid protecting envelope, capable of being slotted into a part of the casing provided for that purpose, the connections of an electrical nature being effected with the aid of appropriate connectors, the architecture of which, moreover, does not limit their use to the context discussed below but is often equally valuable for effecting electric connections of traditional electronic cards, such as those previously mentioned.

The present invention seeks to make possible a generalisation of the use of this principle of "electronic cards". Accordingly it provides an assembly including a modular electric circuit and a connector intended for connecting said circuit to an autonomous electrical system, the assembly comprising a casing (in common with similar known assemblies) which contains both said circuit and the connector, and means for removably securing the casing to the system in a position which gives rise to said electrical connection between a first plurality of conductive pathways, electrically connected to points in the circuit which are to be connected to the system, and a second plurality of corresponding conductive pathways which belong to said system.

A modular assembly of this type should have a simple general design, should be particularly reliable, economical and of notably reduced dimensions, especially as regards its thickness. The assembly according to the invention should thus be adapted for association with a pocket computer, of the type described for example in European Patent Application No. 0 053 061, ie a computer of very small bulk, the maximum dimensions of which are generally of the order of 20 cm long × 11 cm wide × 2.5–3 cm thick. In spite of having such a small thickness, a computer of that type usually comprises a keyboard of the transparent touch-sensitive type, occupying practically the entire surface of one of the two principal faces of the casing of the computer, and a liquid crystal display panel (LCD) disposed beneath the keyboard, the whole being placed in the casing, on top of numerous electronic circuits necessary for the computer to work, the whole nevertheless having a thickness of 1–1.5 cm. This means that the available space within the thickness of the computer, for an assembly of the kind described above, intended to be secured to the casing, on the side opposite the face which carries the keyboard, is particularly restricted and does not much exceed about 3 mm. In spite of an exceptionally limited thickness, the assembly in question is supposed to enclose in its casing a manual activating mechanism of miniaturized structure, for switching on and off the modular electric or electronic circuit mounted integrally with it on the casing, and which is also supposed to effect, simultaneously, the locking or latching of this assembly onto the autonomous system to which it is intended to be electrically branched, in the "in service" position of the circuit.

In the modular assembly according to the present invention the casing has a recess opening upon a portion of its lateral surface and defining, upon said surface, a window of substantially rectangular shape, whose position upon the casing is such that when the casing of the assembly is secured to the system by a locking or latching mechanism, the edges of said window pose at least a portion of the length of the assembly of second conductive pathways of the system, a substrate existing in the form of a flexible tongue of insulating material projecting into the recess, spaced apart from the window, beginning at a first face of the recess and terminating at a first edge of the window, in the direction of a second face of the recess, terminating at a second edge of the window, opposite the first edge, a first plurality of conductive pathways being carried by that face of the tongue which is turned towards said window, and extending, upon the tongue, from its origin to its free end. Elastic means keep the tongue in a tucked-away position in the recess and restore it to that position when it has been displaced therefrom. Furthermore a push mechanism allows flexure of the tongue, against said elastic means, far enough to place the first plurality of conductive pathways in contact with the second plurality of corresponding pathways belonging to the system, and to maintain this contact at least in a first operating position of the mechanism, the mechanism allowing the tongue to be given over to the sole action of said elastic means, at least in one other operating position thereof.

In a first embodiment, the floor of the recess of the assembly wall separating the recess from a rectilinear sliding track housed in the casing, at least one part of the floor of which track is constituted by the other face of said wall, wherein this wall is traversed by a rectilinear slot, parallel to said first and second edges of said window and perpendicular to the longitudinal axis of the track, by the fact that the pusher comprises at least one rectilinear bar of circular section, freely engaged in said slot and in contact, by way of a first longitudinal ridge, with said flexible tongue and, by way of another ridge (positioned substantially opposite the first ridge) in contact with the sole of a shoe slidably mounted on said sliding track, said sole having a plane profile over the greater part of its surface and being additionally profiled on a portion of that surface adjacent to the plane part and across a width substantially corresponding to the length of said bar, in such a way as to define, together with said wall, a clearance which communicates with said recess at least in a first limiting axial position of the shoe, the maximum depth of this clearance, the thickness of said wall and the diameter of the bar being chosen such that, in this position of the shoe, the bar projects into the interior of the clearance, under the action of said elastic means, to a height sufficient for effecting the maintenance of the tongue in its tucked-away position in the interior of the recess of the casing, whereas, in a second axial limiting position of the shoe, opposite to said first position, said clearance is occupied by the shoe at least in the part thereof directly exposed to said rectilinear slot, the sole of the shoe being moreover in contact with said bar by its planar part and repelling the bar to the interior of the slot in such manner that the bar then projects into the recess of the casing to a depth sufficient for governing a flexure of the tongue adapted to ensure mutual contact of the conductive pathways belonging to the first plurality of these pathways and of those belonging to the second said plurality.

In a second embodiment, the casing of the assembly comprises two rectilinear cutouts made in its wall opposite to the wall having said window, symmetrically disposed on either side of the longitudinal axis of the casing, each cutout communicating with said recess across said second face, the push mechanism includes a sleeve enveloping the casing in the part thereof which has said recess, and slidably mounted on rectilinear guide tracks housed on the external face of the casing and oriented parallel to said longitudinal axis, this sleeve having at its end which faces said cutouts two tabs of width less than that of the cutouts, and each disposed in the axis of a particular cutout, in the interior of the corresponding cutout over at least a part of its length. That assembly comprises abutment members being part of the casing, defining the travel of the sleeve over the casing between two limiting positions, one in which said tabs hold said tongue in the flexed position governing said electrical connection, the second position in which the tongue is given over to the sole action of said elastic means, said electrical connection being interrupted.

Further details and characteristics of the present invention will now be described with reference to the attached drawings, given by way of example, in which FIG. 1 is a perspective view of a pocket computer from above;

Figure 1:
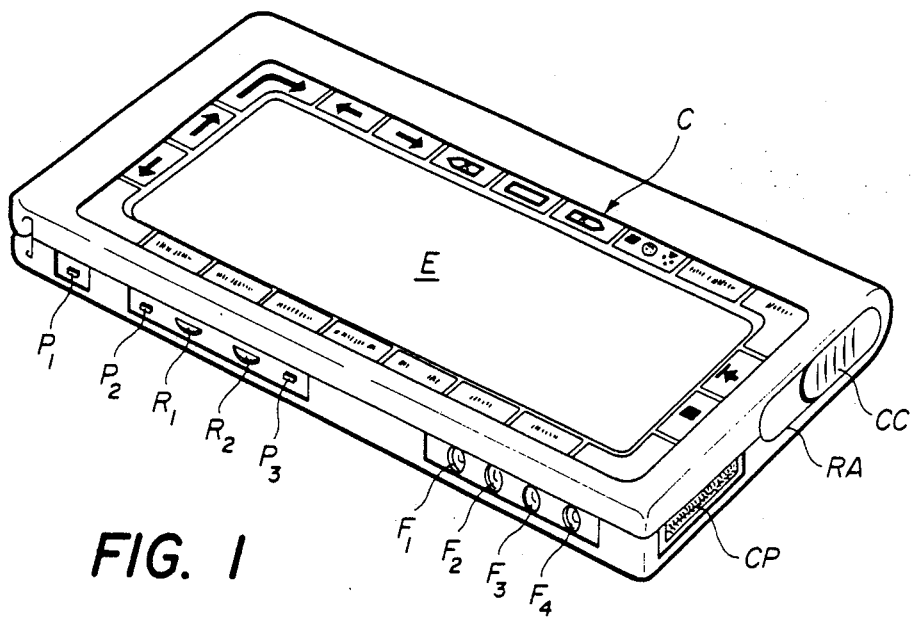
Figure 2:
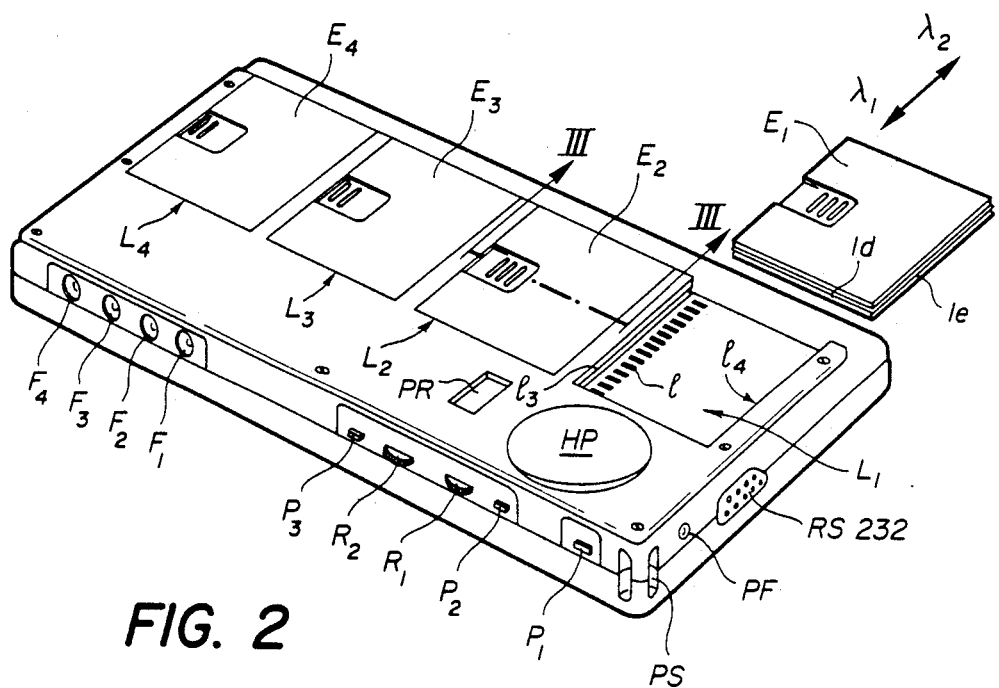
FIG. 2 is a perspective view, from below, of the computer shown in FIG. 1.

The computer shown in FIGS. 1 and 2 is a pocket computer, of a type similar to that described in the European Patent Application No. 0 053 061, namely a calculator having specially reduced dimensions (about 20×11×3 cm) for an exceptionally high quality of performance in such a small volume.

The upper face of such a computer presents, in its central part, a rectangular screen E comprising a keyboard of the transparent touch-sensitive type, and a liquid crystal display (LCD) panel diposed below the keyboard, the screen being surrounded by a zone C of computer control and actuating keys. On its edge, the illustrated computer has various regulating buttons (R1, R2) and command keys, such as a push button (P1) for switching on the computer, a second push button (P2) for switching it off and a third push button (P3) for re-starting the computer system, sockets (F1-F4) allowing connection to various apparatus (microphone, cassette deck, earphone for example), a series RS 232 interface in front, allowing connection to peripherals, such as a printer for example, a socket PF for connecting the computer to an external power source, a passage PS, housed in the casing of the apparatus for a holding strap (not shown), a parallel connector CP, of 40 pins, for connecting the computer to a modem, to a printer or to measuring apparatus for example, the opening of a compartment intended for receiving feed wires of the computer, this opening not being visible in the drawing because masked by a cover CP slidably mounted in a groove RA incised in the casing, this cover being thus capable of being conducted from the position represented, in which the battery compartment is covered, to a second position, offset to the first, in which the user can have access to this compartment, especially for replacing used batteries. The computer illustrated includes on its face opposite to that equipped with the screen E, a push button PR governing the computer RESET function, a loudspeaker HP and four housings L1-L4 intended for the reception of a corresponding number of non-mobile assemblies E1-E4 whose structual details will be illustrated later herein, these constituting an equal number of memory cards of RAM and-/or ROM type, capable of constituting storage memories for information generated by means of the computer and/or memories containing utility programmes of every kind.

The computer additionally comprises, in that portion of the volume of its casing substantially included between the screen E and the housings L1-L4, the substantial totality of the logic circuits and connections necessary both for the functioning of the keyboard and display, and for the initiation and execution of the various functions proper to the computer. All these elements, not having a direct relationship to the essential characteristics of the assembly according to the invention, have not been illustrated and will not be described.

As shown, the computer seen in FIGS. 1 and 2 makes important use of memory cards E1-E4 which are intended for introduction in immovable manner into the interior of the corresponding housings L1-L4, themselves formed in the casing of the computer, said cards being adapted for electrical connection to the computer in question, whether for supplementing the capacity of its working memory, or for giving access to special programmes or parts thereof, which are not present in the basic memory of the apparatus. As already shown, since we are dealing with a portable computer of particularly small dimensions, the above memory cards may exhibit reduced dimensions, of the order of 55×45 mm side lengths and about 3 mm thickness, and can be attached to the computer or separated therefrom manually, without making use of special tools, their electrical connections being positive and permanent no matter what may be the movements and position modifications to which the computer may be subjected.

Accordingly, the invention provides an assembly encompassing a modular electrical or electronic circuit, and a connector intended for electrically connecting this circuit to an autonomous electrical system, including a system other than a computer. In particular this assembly could be used in portable apparatus of a different kind, radios or television sets for example, in (remote) control panels of various installations, in telephone exchanges, telecommunications stations etc.

As can be seen in FIG. 2, the modular assembly E1 is intended for insertion in the housing L1 of the computer for electrical connection to the latter by way of the bus bars $p$, of which only a few have been represented so as not to crowd the drawing uselessly.

In FIG. 2, the structual elements which equip the modular assembly E2 (just introduced into its housing L2) so as simultaneously to permit the electrical contact mentioned, and the mechanical securing of this assembly in its housing, are distinguished. The element E2 is structurally identical to the element E1 above.

Figure 3:
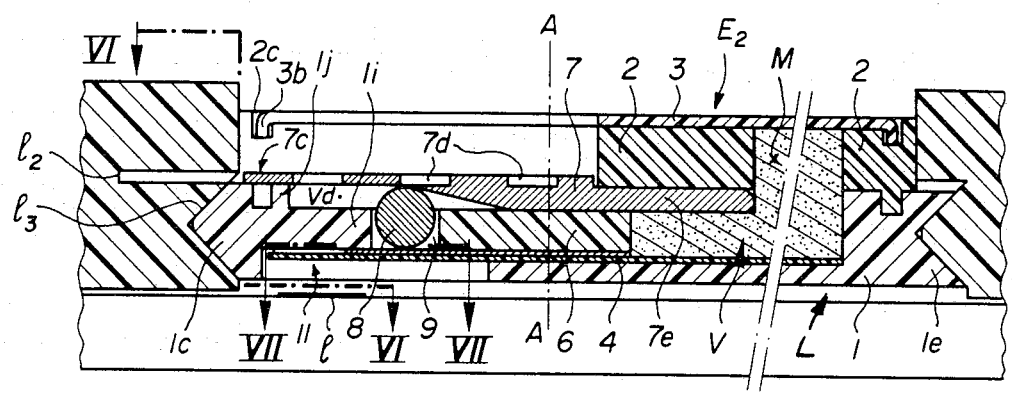
FIG. 3 is a view in vertical section, on an enlarged scale, along the line III—III of FIG. 2, showing the structural elements of the connector with which the modular assembly is furnished, according to a first embodiment of the invention.
Figure 4:
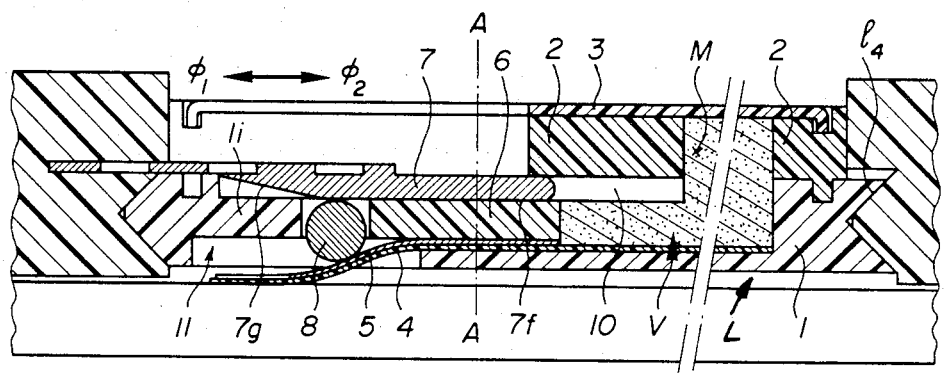
FIG. 4 is a view similar to that of FIG. 3, in another position of certain components of the connector.

An assembly of this kind is obtained substantially by the superposition and fitting together of different components which will now be described with particular reference to FIGS. 3-7 of the attached drawings. It includes (FIG. 5) a casing made up of a rectangular base 1 on which rests a frame 2 whose opening is occluded by a cover 3. Between the base 1 and the frame 2, the illustrated assembly shows a plaque 4 of flexible insulating material, constituting a printed circuit or PC board, to which are fixed the microchips of the logic circuits belonging to every assembly, elements which have not been illustrated but which are located within the volume V which is left free between this plaque 4, the frame 2, the cover 3 and a filling mass M, of epoxy resin for example (FIGS. 3 and 4).

The four elements 1-4 are assembled by means of screws (not shown) engaged in the openings 1' and 1" of the base 1 and traversing the corresponding passages 2' and 2", 3' and 3", 4' and 4", provided respectively in the elements 2, 3 and 4. As a variant, the same assembly could be achieved by means of plugs in thermoplastic material, projecting for example through the parts occupied by the openings 1' of the base 1 and whose upper end could be fused at the time of assembly in order to form a closure head. It is appropriate to point out at this time that both the base 1 and the frame 2 are for preference made in plastics material, moulded for example in ABS doped with teflon; as regards the cover 3 by contrast, that can be made by stamping a sheet of stainless steel.

Figure 5:
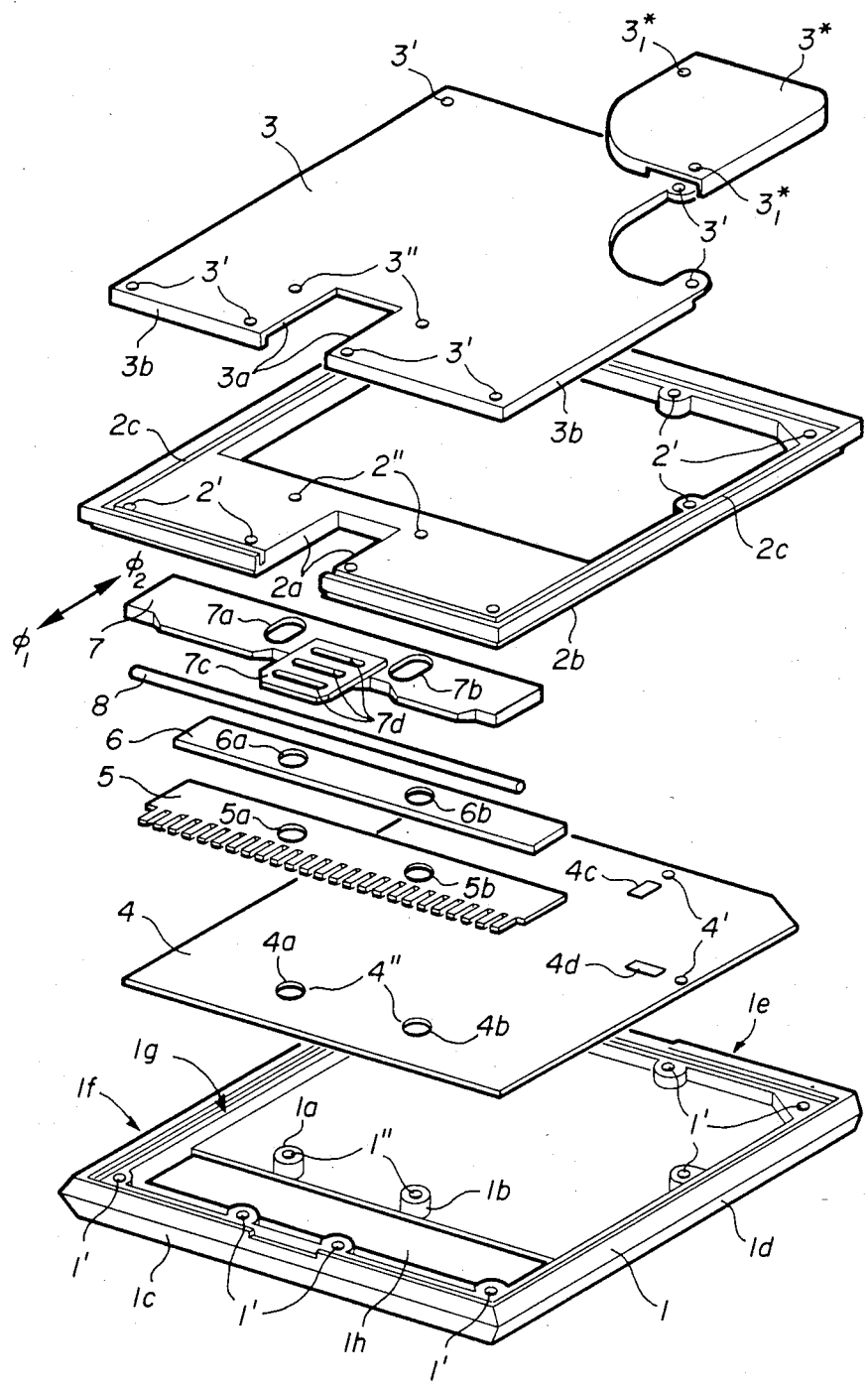
FIG. 5 is an exploded view, in perspective, showing a part of the components of the assembly.
Figure 6:
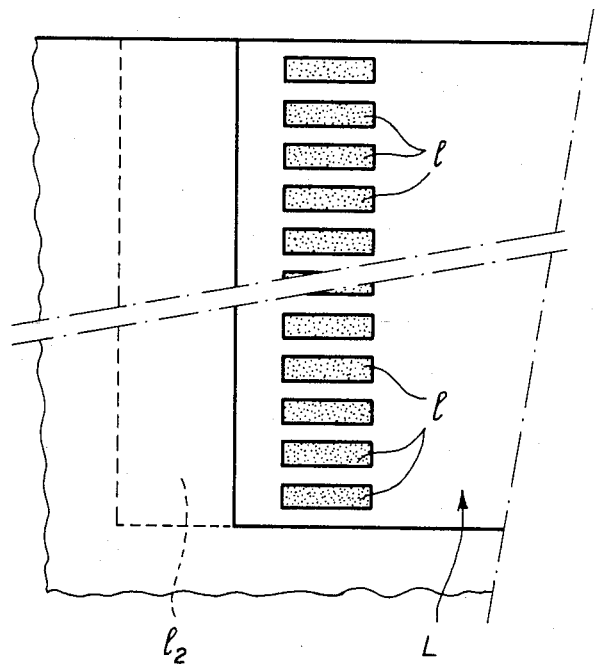
FIG. 6 is a detail view along the line VI—VI of FIG. 3.
Figure 7:
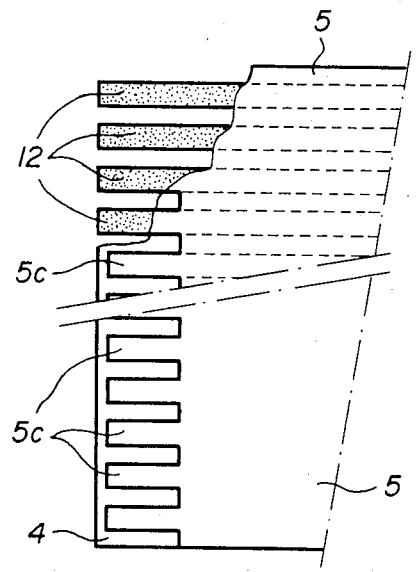
FIG. 7 is another detail view of the same FIG. 3, along the axis VII—VII with certain elements partially torn away.
Figure 8:
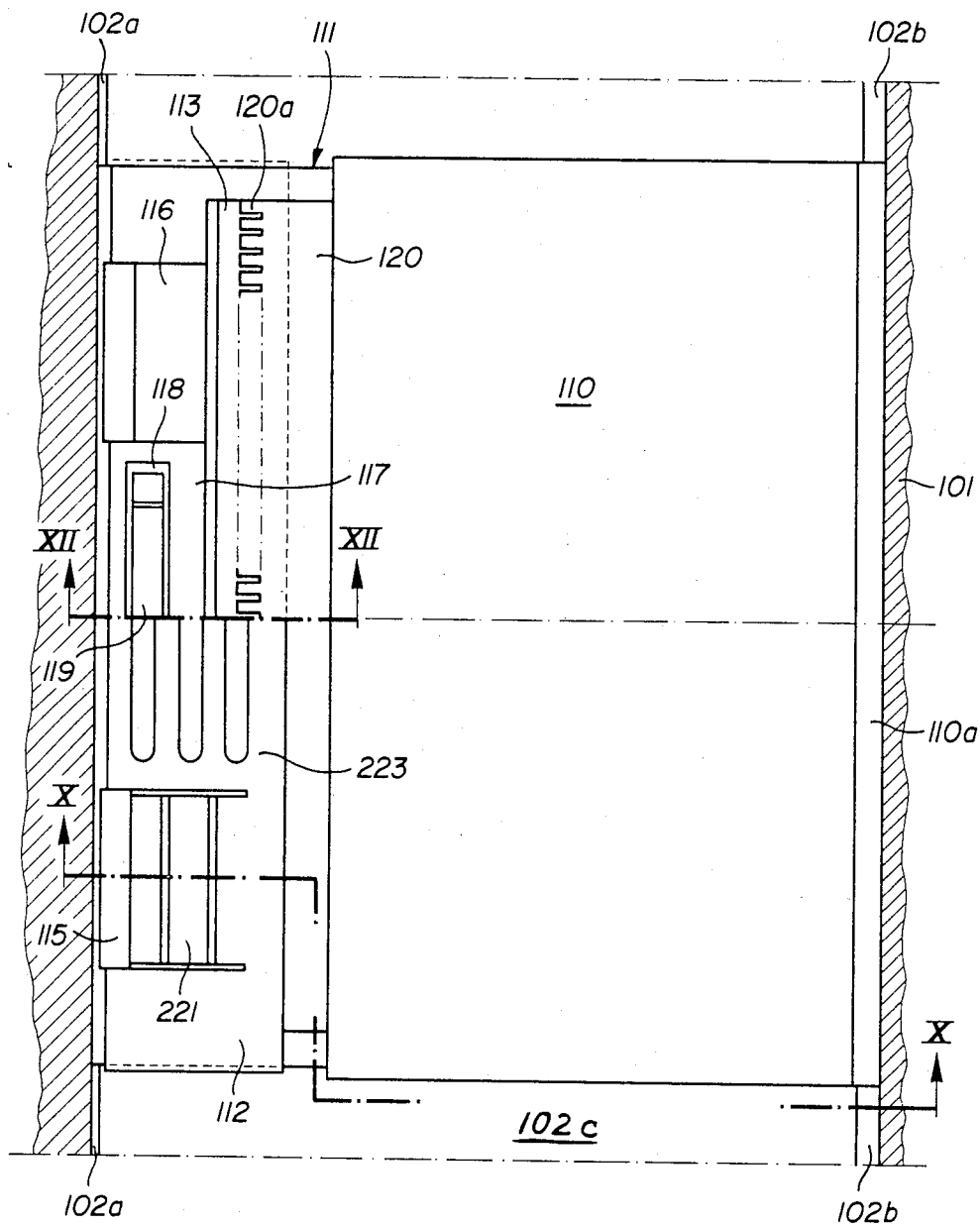
FIG. 8 is a plan view on a large scale of a second embodiment of the modular assembly according to the invention.

As can be seen from FIG. 5, the openings 1" of the base 1 are located in cylindrical bosses 1a and 1b projecting above the floor of the base, in the immediate neighbourhood of the rear edge of a window 1f. These bosses constitute locating means for the PC board 4 (by engagement in openings 4a and 4b) and for a comb-spring 5 and a cross-piece 6 (by engaging in openings 5a, 5b and 6a, 6b respectively). In FIGS. 3 and 4, the positions of these bosses is marked by a representation of their axis of symmetry A—A.

The bosses 1a and 1b additionally constitute location and guide elements for a shoe 7 in its locus of rectilinear displacement in the direction $\phi 1$ or $\phi 2$, by engagement in oblong openings 7a and 7b, oriented according to the axis $\phi 1$-$\phi 2$. The length of these openings, 7a and 7b, and the diameter of the bosses 1a and 1b of the base 1 fix the extent of axial displacement possible for the shoe 7 in the direction $\phi 1$-$\phi 2$.

This shoe is furnished with a laminar dais 7c (FIGS. 3-5) perforated by three parallel slots 7d forming what amount to grasping means in front, allowing the user to govern (for example by means of a finger) the sliding of the shoe from a first limiting position, retracted (FIG. 3), into a second limiting position of projection (FIG. 4), in which the dais 7c becomes engaged in a receiver slot $\rho 2$, carried by the lateral wall of each housing L1-L4 of the computer.

Let us return to the base 1: as can be seen more especially in FIGS. 3 and 5, the exterior periphery of this base has a chevron profile about two adjacent sides, 1c and 1d, and a corresponding rabbeted profile on the two other sides, 1e and 1f. Thus, each assembly E1 to E4 can only be introduced into the corresponding housing L1-L4 of the computer by sliding it in the direction $\lambda 1$, in a groove 13 for the side 1c, and on a slide 14 for the side 1e of corresponding shape, provided on the long edges of each housing L1-L4. It is only following such an engagement that the user is able to latch the assemblies E1-E4 in their respective housings L1-L4 by displacing the dais 7c of each relevant assembly in the manner described above (sliding in the direction $\phi 1$—FIG. 5). The removal of one or other of these assemblies will be accomplished by displacing the dais in the direction $\phi 2$ (FIG. 5) opposite to the first displacement, and thereafter displacing the assembly in the direction $\lambda 2$ (FIG. 2).

In order to permit convenient finger access to the dais 7c of each assembly, the frame 2 has a rectangular cutout 2a, of length and width corresponding essentially to the length and width of the dais 7c. The cover 3 is likewise provided with a rectangular cutout 3a, with dimensions corresponding to those of cutout 2a of the frame 2, these two cutouts being positioned in such a way that when the elements of the structure represented in FIGS. 3-5 are assembled, they are exactly located one above the other, the edges of the cutout 2a encompassing the dais 7c along its two long edges.

It will be noted once more that, in order to centre the elements 1, 2 and 3 correctly during assembly, independently of the action of the assembly screws previously discussed, the frame 2 is equipped on its lower face with a peripheral rib 2b, which fits over the periphery of the upper opening 1g of the base 1, and on its upper face with a groove 2c (FIGS. 3 and 5) intended to receive the turned-down edge 3b of the cover 3. This rib also serves for the box-lid engagement of a cap 3* intended to cover a battery (not shown) occupying a space in the part of the volume comprised between the PC board 4 (4c and 4d represent positive and negative contacts to which the battery is attached), the space defined by the portion of the frame 2 at the upper right hand corner of the latter (FIG. 5) and by the cap 3*. This battery is thus intended for the electric feed of the microchips carried by the PC board 4; it is especially necessary when the microchips are of the RAM whose stored information it is desired to preserve even if the corresponding assembly E1–E4 has been removed from the computer. This cap is fixed on the cover 3 by screws, not shown, which penetrate the cap 3* along passages 3*', the frame 2 and the circuit 4 and are secured in the base 1 by engagement in the three openings 1' located, in the drawing, at the upper right hand part of this base.

Referring more particularly now to FIGS. 3 and 4, it will be seen that, on its rear face, the side 1c of the base 1 extends in the form of a lath 1i, of width corresponding to that of the cross-piece 6 and having on its upper face a rib 1j against which the dais 7c of the shoe 7 abuts. Once more it is to be noted that the lower face of the lath 1i extends in a level higher than that of the floor of the base 1 by a value corresponding to the sum of the thicknesses of the comb 5 and the printed circuit 4.

In addition to the elements described, the assembly according to the invention also contains a bar 8 of circular section, the diameter of which is greater than the thickness of the cross-piece 6, and substantially corresponds to the thickness of the lath 1i at the level of the rib 1j, and whose length is identical, at the same time, to that of this cross-piece, to that of the comb 5 and to that of the shoe 7, all being slightly less than the length of the rectangular window 1h carried by the floor of the base 1.

This bar is freely engaged in a rectangular slot 9 having a width slightly greater than the diameter of the bar 8, and which is defined, as to its long edges, by the edge of the lath 1i and by the front edge (drawings, FIG. 5) of the cross-piece 6 and, as to its short edges, by portions of the sides 1d and 1f of the base.

As can be seen in greater detail in FIGS. 3 and 4, the shoe 7 is engaged by its posterior part 7e, in a slot of rectangular section, 10, the walls of which are constituted by the frame 2, by the mass of filling material V and by a portion of the cross-piece 6 upon which the shoe rests with a first, planar part 7f of its sole, adjacent a second part 7g of inclined profile, teminating at the dais 7c of the shoe. It should be noted that the width of this shoe, in that part engaged in the slot 10, is slightly less than the width of the slot, whereby the shoe can be displaced by sliding in the direction φ1, from its retracted position (FIG. 3) into its projecting position (FIG. 4) or, in the direction φ2, contrary to the first direction, for returning the shoe to the retracted position. Just as has been indicated above, the maximum distance capable of being travelled by the shoe 7 in the course of these displacements is fixed by mutual contact of the bosses 1a and 1b with the oblong openings 7a and 7b previously mentioned.

In the modular assembly according to the invention, the bar 8 is simultaneously in contact with the shoe 7, through a longitudinal ridge, and with the comb 5, by another similar ridge, located diametrically opposite to the first ridge. It is useful at this point to mention the fact that the comb, which, as described, consists of a leaf spring in stainless steel, is secured, for example by glueing, to the upper face of that portion of the PC board 4 which is clamped between the floor of the base 1 and the cross-piece 6, as well as projecting freely into a recess 11 (FIGS. 3 and 4), adjacent the floor thereof, this recess being defined by the base 1 (especially by the rib 1i and by the floor of this base) and by the cross-piece 6.

The free edge of the comb 5 is broken by a series of teeth 5c which weaken this edge and in that way give it increased flexibility. The spacing and width of the teeth 5c thus corresponds to the spacing and the width not only of the bus bars ρ appearing on the floor of each housing L1–L4 of the computer (FIGS. 2 and 6) but also of a corresponding number of conductive pathways 12 with which the lower face of the PC board 4 is furnished (FIG. 7), these pathways extending as far as the interior of the volume V in which the microchips of the electronic card which the assembly E in question forms are disposed, said pathways forming part of the coupling circuit of these microchips.

The pathways 12 are, for preference, upholstered by a contact bed of a precious metal such as gold, in that portion which is intended for contact with the bus bars 1. For example, it will be seen that such pathways can have a width of the order of eight-tenths of a millimeter for a spacing of the order of four-tenths of a millimeter. If need by they could have dimensions of a lower magnitude while still offering complete reliability as to their intrinsic qualities for a remarkably extended lifetime. Thus the general design of the assembly 5 described allows one to effect mutual contact with the two opposed arrays of pathways (1 and 12) with very little mutual abrasion, of progressive intensity and yet without scratching.

As can be seen in FIG. 3, when the shoe 7 is located in its retracted limiting position, it defines, together with the portion 1i of the base 1 and the cross-piece 6, an empty space Vd into which the slot 9 opens. The height of this space Vd, the diameter of the bar 8 as well as the thickness of the rib 1i and of the cross-piece 6 are advantageously chosen such that, in the retracted position of the shoe 7 (FIG. 3), this bar can partially penetrate into the space Vd under the action of the elastic blade which forms the comb 5, so that the assembly formed by the comb and the PC board 4 to which it is glued then occupies a practically horizontal position, tucked away into the interior of the recess 11.

If, on the other hand, the shoe 7 is displaced in the direction φ1, in order to bring it into its far left position in the drawing, the inclined part 7g of the sole of the shoe comes in contact with the bar 8 and pushes it gradually towards the interior of the slot 9, in opposition to the elastic blade 5, making it project into the recess 11. Since the bar 8 cannot undergo such displacement except by causing the blade 5 to flex and consequently the PC board 4 which is associated with it, it follows that the end of the PC board gradually approaches the floor of the housing L in which the assembly E in question is engaged, it exits from the recess 11 and thereafter causes gradual contact of its conductive pathways 12 with the pathways 1 which are flush with the floor of the housing L.

When the shoe 7 has stopped moving, the PC board occupies the position seen in FIG. 4, in which its own pathways have been applied along practically the entire length of the said pathways 1, exerting sufficient pressure to guarantee a perfect electric contact. It is useful to mention at this point that, thanks to the fact that the bar 8 has a cylindrical profile, the flexure of the assembly comb 5 and PC board 4 under the action of this bar is effected in a particularly gentle manner, without jerking, since the bar is capable of rolling about itself, inside the slot 9, and against the surface of the comb 5, thus contributing to the achievement of a particularly gentle contact of the conductive pathways of the PC board with those on the floor of the housing L.

The second embodiment of the modular assembly according to the invention is more particularly the object of FIGS. 8–13.

In the drawings (FIG. 8) 101 represents a part of the casing of a portable computer, similar to that illustrated in FIGS. 1 and 2, but the bottom of which is not depressed, any more, by four slots L1 to L4 but by a single longitudinal elongate groove 102, the lateral walls of which in turn are undercut by throats 102a and 102b of triangular section (FIGS. 9 and 10), extending over the entire length of the groove 102, the bottom 102c of which is formed by the reverse side of an insulating shield 103 constituting a printed circuit on the obverse side of which are fixed chips such as 104 in conventional manner, this shield thus constituting the "PC board" of the assembly.

Figure 9:
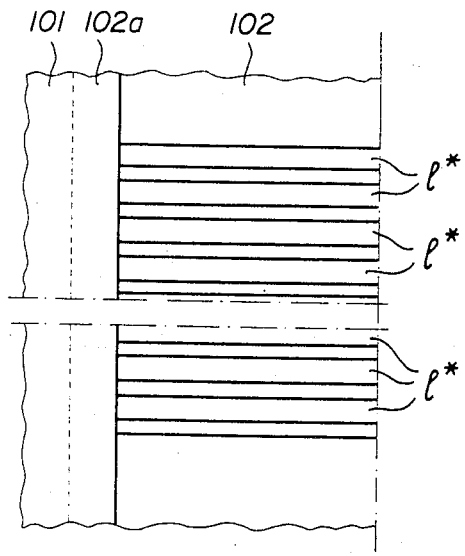
FIG. 9 is a detail view along the line IX—IX of FIG. 10.
Figure 10:
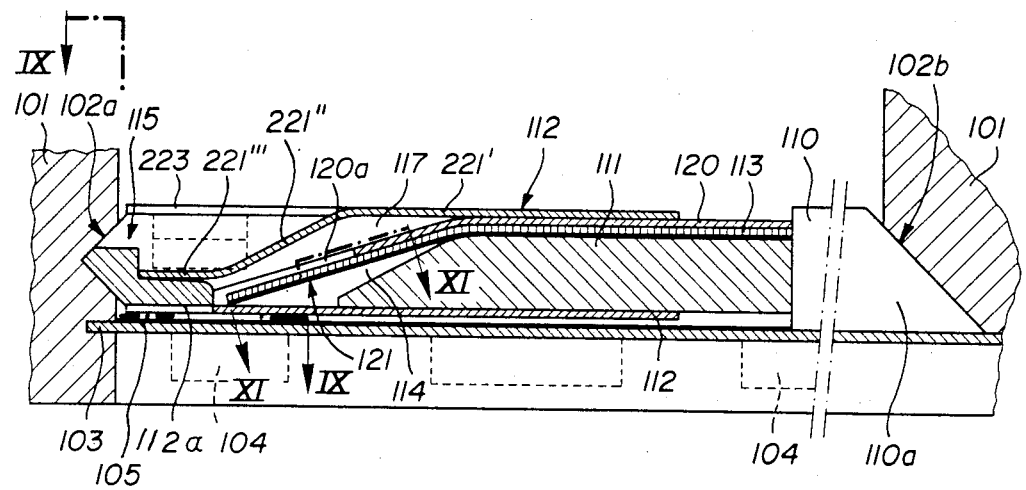
FIG. 10 is a partial section along the line X—X of FIG. 8.

In the case in question, the visible part of this PC board is, in particular, the one which is intended to permit electrical junction with the computer of non-movable electronic circuits which may constitute all kinds of elements of peripheral software such as extension or complement memories of the basic RAM and ROM of the computer, storage memories, particular programmes of every kind, etc. As will be gathered in a more detailed fashion from what follows, the branch connection is intended to be made by means of a plurality of bus bars which are present in the form of a plurality of conductive paths 1*, extending in parallel on the reverse side of the shield 103, (FIGS. 9 and 10). These pathways can be produced in any manner, according to known techniques of manufacture of printed circuits. In the example, these pathways have a width of the order of 8/10 mm with a spacing apart of 4/10 mm and extend, in a group of forty, from the edge of the groove 102 which bears the throat 102a to the other edge of that groove, over a length of one to two centimeters or even across the entire width of the groove, as the case may be.

The groove 102 of the casing 101 is intended in fact to receive one or more modules embracing exactly those software elements recited above, the general architecture of which, as well as their essential structural peculiarities will now be described. A module of this kind is made by assembly of three principal parts, viz a casing 110 ending in a connection plug 111, and a slider 112 adapted to act on certain components of the plug 111 for electrically connecting the circuits of the modular assembly to the bus bars 1* already mentioned, or disconnecting them. The slider 112 can also govern the mechanical latching or bolting of the corresponding assembly in the groove 102, in a relative position appropriate for the transfer of information from and to the modular assembly through the intermediary of the bus bars 1*.

As can be seen in the drawing, the casing 110 is completed by a kind of pocket on the bed 110a, of right angled triangular section (FIGS. 8 and 10) by which the modular assembly can be inserted and longitudinally slid in the throat 102b of the groove 102 of the computer. This casing can be made in stainless steel or in hard plastics material. It contains, in substance, the complete collection of chips concerned in the function entrusted to the modular assembly, mounted in conventional manner on a printed circuit constituting the PC board of the assembly, and which is formed on a sheet of flexible synthetic material, for example epoxy resin, whose left hand extremity 113 projects into the interior of the connection plug 111 (FIG. 10).

In the embodiment represented, the lateral faces, the upper face and the lower face of the casing 110 are planar and parallel in pairs. For example, it can be said that such a casing can have a thickness of 2-3 millimeters, which is exceptionally small for this type of article.

The connection plug 111 is designed in the form of a small slab of plastics material forcibly inserted by its right hand end as seen in the drawing, into the opening of the casing 110, and whose left hand end has two bevels 111a and 111b forming a dihedral by which the plug 111 is inserted into the throat 102a formed by the left face of the groove 102 of the casing 101 of the apparatus.

As can be seen in the drawing (FIGS. 10 and 11) the small slab forming the plug 111 is traversed by a passage 114, which is open towards the upper as well as the lower face of the slab, and the width of which increases according as it extends from the former towards the latter. Once again it will be noted that the passage 114 begins approximately midway along the upper face of the slab, and ends adjacent the left hand end of the lower face thereof.

That part of the connecting plug contained between this passage 114 and its end is truncated by two cutouts 115 and 116 defining a kind of central beak 117 housing a recess 118, of generally parallelepipedal shape, in which is disposed a "lyre" spring 119, tending to project when disengaged (FIG. 12), and possible to tuck away entirely in the housing 118 by simple finger pressure on the upper part.

The bed of the cutouts 115 and 116 has a "staircase" profile of two steps, extending to the lower face of the plug 111. The upper step constitutes an abutment member intended to fix one of the limiting positions capable of being occupied by the slider 112, as will be described in what follows.

As can be seen in this figure, the insulating sheet 113, constituting the PC board of the assembly shown, is held in contact with the portion of the plug 111 forming the beak 117, situated to the left of the passage 114. This sheet extends along practically the entire length of this passage almost as far as the lower face of the plug 111.

Figure 11:
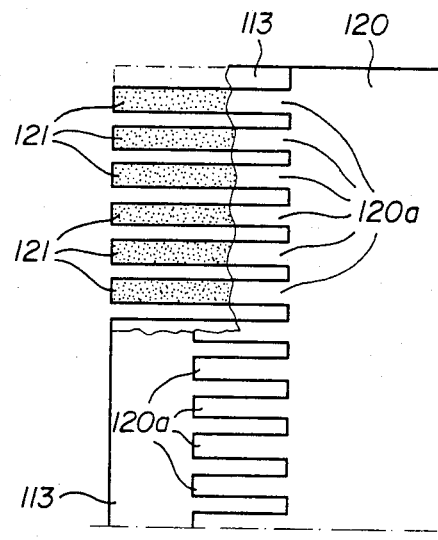
FIG. 11 is a view along the line XI—XI of FIG. 10, with partial tearing away.
Figure 13:
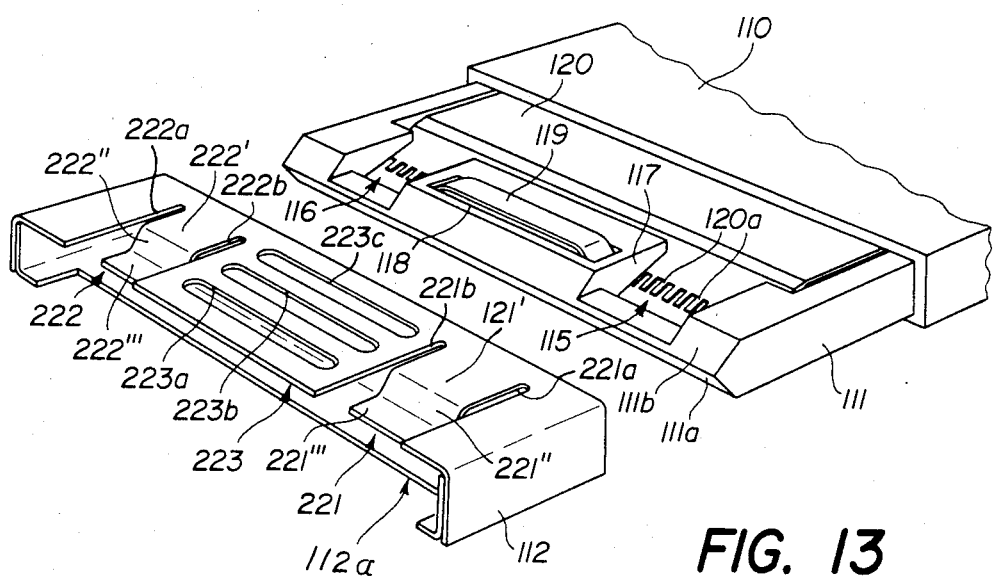
FIG. 13 is an exploded view in perspective of part of the assembly represented in FIG. 8.

In fact, this sheet 113, along the greater part of its length, is protected by a kind of shell, in the form of a thin sheet 120 of stainless steel, secured to the sheet itself, for example by adhesion, the free edge of which, offset from the corresponding edge of the sheet 113, is cut off in such a way as to form a series of teeth 120a (FIG. 11). By means of this dentition, the shell 120 is locally weakened so as to give it an increased flexibility making possible there an easier deformation in response to flexure of the underlying part of the sheet 113.

The metal sheet 120 has been preformed so as to play the part of an elastic means tending constantly to urge the sheet 113 into the position visible in FIG. 10 if that sheet has been dislodged therefrom.

The size as well as the spacing of the teeth 120a of the shell covering the sheet 113 correspond at all points to the size and the spacing of a plurality of conductive pathways 121 with which the lower face of that sheet is embellished, these pathways extending as far as the interior of the casing 110 and forming a part of the printed circuit for coupling the various chips of the electronic circuit disposed within the casing. In the part of them comprised between the end of the teeth 120a of the shell 120 and their own free end, the conductive pathways 121 are covered for preference with a contact bed of a precious metal, for example of gold.

As will be seen later on, the conductive pathways 121 are intended in fact to be brought into contact with the pathways 1* which appear at the base of the groove 102 of the casing 101 of the electronic apparatus with which the assembly in question is to be associated: their size and their spacing will therefore be identical in value with the size and spacing of the pathways 1*.

The electric contact between the electronic circuit of the assembly formed by the elements 101, 111 and 112 and the electronic circuit carried by the PC board which the slab 103 constitutes is achieved by direct contact between the conducting pathways 1* of the printed circuit which that slab carries and the conducting pathways 121 with which the lower face of the flexible sheet 113 is equipped. Likewise, as will be seen later, such a contact is obtained with reduced friction between the pathways thereby clearly assuring the minimum wear and tear but an excellent lifetime of the active surfaces of the opposing pathways.

Manual action of the slider 112 is what achieves both the electrical connection of the conducting pathways 1* and 121 and the breaking of said connection.

A slider of this kind is in fact made in the form of a sleeve of straight rectangular section (FIG. 13), made by assembling two U-section angle pieces, for example in stainless steel of 2/10 to 3/10 mm thickness, the opening of which has a section substantially corresponding to that of the plug 111. This slider is engaged by sliding over the plug and can be manually brought from a first limiting position, visible in FIG. 10, into a second limiting position (FIG. 12) and vice-versa.

The lower face of the sleeve 112 is truncated by a rectangular cutout 112a (FIGS. 10 and 13) extending practically the entire width of the slider, the depth of which is chosen such that in the first axial limiting position of the slider (FIG. 10) the lower opening of the passage 114 is blocked by the slider, while the same opening is freed in the other limiting position.

On its upper face, the slider 112 comprises in addition two pairs of parallel incisions 221a, 221b and 222a, 222b respectively, of a spacing corresponding essentially to the width of the cutouts 115 and 116 already mentioned, thus defining three tabs 221, 222 and 223, of which the last, 223, which is of general rectangular shape, is located very exactly in the centre of the upper face of the slider 112, coaxially to the longitudinal axis of the latter. Three windows, 223a, 223b and 223c let into the tab 223 constitute sufficient voids to allow the user, wishing to activate the slider, easily to grasp or engage the latter with the fleshy part of the tips of his fingers.

Each of the other two tabs 221 and 222 has three essential parts, namely a first part 221' and 222' respectively, extending in the general plane of the upper face of the slider, by which the tab in question remains integral with the rest of this face, a second part 221'' and 222'' respectively, inclined toward the lower face of the slider and towards the rear thereof, and a third part 221''' and 222''' respectively, integral with the second part of the respective tab and extending parallel to the two faces, lower and upper, of the slider 112. In the transition zone between the adjacent parts 221', 221''; 221'', 221'''—and 222', 222''; 222'', 222''' respectively of each tab, these tabs are slightly weakened by impressing a groove of little depth into the thickness of each tab. In this way, it has become possible to increase the natural flexibility of such tabs.

As can be seen in FIG. 10, the length and inclination given to the intermediate part 221'' and 222'' respectively of the tabs 221, 222, are chosen so that the lower face of the end part 221''', 222''' respectively of this tab extends at a level slightly higher than the level of the lower step of the base of the cutout 115, 116 respectively, appearing on either side of the beak 117 of the plug 111. Additionally, it will be noted that, when the slider occupies the position visible in FIG. 10, the tabs 221 and 222 prevent the disengagement of this slider from the plug 111, by subsequent displacement of the slider towards the left of the drawing, because they are in engagement with the upper step of the base of the cutouts 115 and 116, these steps thus playing the part of an abutment. In this same position of the slider, the lower opening of the passage 114 of the plug 111 is obstructed by the lower face of the slider, although the latter completely covers the upper face of the beak 117 by its tab 223, which keeps the lyre-spring 119 in a tucked-away position in the housing 118. Eventually, it will be seen that the two tabs 221 and 222 occupy a position remote from that portion of the composite assembly formed by the flexible sheet 113, the conductive pathways which it carries on its lower face and the shell 120 which covers it, a portion which practically traverses the passage 114 through and through and which is freely supported on the beak 117 of the plug 111 as described previously.

If the sleeve 112 is displaced from left to right of the drawing, in order to remove it from its first limiting position represented in FIG. 10, then the tabs 221 and 222 will tend more and more to approach that part of the above composite ensemble which presses with an elastic bias on the beak 117 of the plug 111, at the same time that the lower face of the slider will mask less and less the lower opening of the passage 114.

A moment arrives in which the tabs 221 and 222 come in contact with the shell 120 covering the flexible sheet 113 causing that shell, and the sheet 113 with which it is integral, to flex downwardly, against the elastic action exercised by the shell 120, so that the lower end of the sheet 113 and of the conductive pathways 121 which are associated with it will be obliged to exit from the passage 114 by its lower opening, in accordance with the vacating or disengagement of this opening by the slider, in its movement towards the right of the drawing.

As the slider 112 continues to be displaced and the tabs 221 and 222 continue to increase the flexure of the shell 120 and the sheet 113 with which it is associated, at a certain moment this sheet and the pathways 121 will come into contact with the slab 103 which constitutes the bottom of the groove 102 into which is inserted the assembly shown, and into contact with the pathways 1* which the upper face of this slab carries. From that instant the part of the flexible sheet 103 located downward of the teeth 120a of the shell 120 will increasingly flex, introducing a more and more substantial length of the pathways 121 into contact with a corresponding length of the pathways 1*.

It is as well to observe at this point that the tabs 221 and 222 then exert on the sheet 113 a force of the order of 1 or 2 kg per tab.

Figure 12:
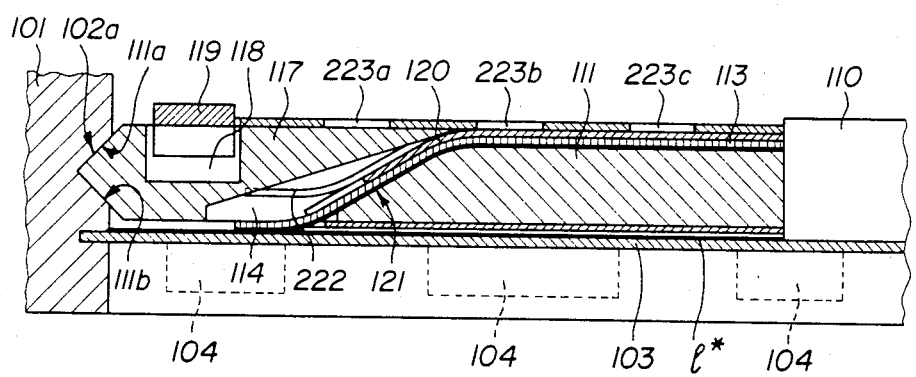
FIG. 12 is a sectional view along the line XII—XII of FIG. 8 in a different position of certain components.

The right hand limiting position capable of occupation by the slider 112 is that represented in FIG. 12. It can be seen that the slider is blocked in that position, to the left by virtue of the lyre spring 119 which is in partial projection from its housing 118, the opening of which is now completely disengaged and, to the right, by virtue of the casing 110 of the modular assembly.

Note further that the lower opening of passage 114 is then completely disengaged by the slider, giving a free passage sufficient for the flexible sheet 113 and its conductive pathways, and that this sheet is sandwiched between the tabs 221 and 222 of the slider, and the right hand wall of the passage 114 against which it is supported.

In order to bring back the slider from its farthest right hand position (FIG. 12) into its left hand limiting position (FIG. 10), pressure is first brought to bear on the lyre-spring 119 sufficient to cause it to withdraw inside the housing 118, thus this slider is pulled to the left, eg by grasping the tab 223 of the slider with the fingers. When this is done, the tabs 221 and 222 slacken their action on the shell 120, which (in turn) will tend to restore the sheet 113 elastically to its rest position shown in FIG. 10; the angular displacement of this sheet has the consequence of a gradual withdrawal of the conductive pathways 121 from the pathways 1*, ie a separation of same, thus the breaking of every electrical connection between the PC board of the computer 101 and the PC board of the modular assembly currently engaged in the groove 102.

The bringing into mutual contact of the pathways 1* and 121, as well as their separation, is thus effected in a particularly gentle manner, without much friction, a gentle deflection of the pathways 121 taking place in the course of the operation. It follows that these switching operations take place with minimal wear of the contact surfaces, assuring a long life for the pathways, which applies equally to the pathways 1* and the pathways 121. This is why, in testing, it has proved possible to make and break many tens of thousands of contacts without noticeable wear.

In a first embodiment, not illustrated, the modular assembly described could exhibit one or several latching tabs, projecting for example beyond the side faces of the slider, and intended to be engaged by corresponding slots arranged on the bottom of the groove of the apparatus into which the module is to be slid, these tabs penetrating into the slots only by starting from a certain axial position of the slider, reached in the course of displacing it from the limiting position of FIG. 10 to the limiting position of FIG. 12. Unlatching will take place during displacement of the slider in the opposite direction, starting from the same axial position.

In a second embodiment, likewise not illustrated, the modular assembly described could be furnished with a switch housed in the plug 111 and capable of connecting the pathways of the PC board of the electronic circuit of this assembly to the chips of the circuit only when the slider occupies the limiting position of FIG. 12, the slider actuating this switch at the appropriate instant. In this way, it becomes possible to ensure that the conducting pathways of the assembly are not carrying any current unless the contact with the pathways of the apparatus for which the modular assembly is intended is complete. Further, in modular assemblies incorporating a battery for powering the chips of their electronic circuit, which is the case, for example, when such a circuit constitutes a live memory, one avoids having a potential on the pathways of such assemblies when the modules have not been brought into an active position. In such an event, it will clearly be possible to use the switch for directly controlling the power feed to the electronic circuit from the battery.

The modular assembly according to the invention, in its present design, as described with reference to the accompanying drawings, has a number of advantages which make it particularly easy to manufacture and use.

It will be seen for example that, in such a module, the elastic return means constituted by the shell 120 takes care of that function only so that it is not traversed by current, allowing this shell to be made in an inexpensive material having no particular electric properties. In the case in question, for example, use has been made of stainless steel sheet of ordinary quality. Moreover, when the module is not in active position because for example it is not in use, and is stored at a distance from the electric system it is to be associated with, the conductive pathways carried by the flexible sheet 113 are completely protected, sheltered from all possible contamination and from every contact likely to cause them to deteriorate, since the elements of the modular assembly occupy the position of FIG. 10, in which the slider 112 blocks the two end openings of the passage 14 of the plug 111.

It will be noted, once again, that in spite of the much reduced thickness of the modular assembly described (2 to 3 mm), the travel of the end portion of the sheet 113 is relatively important and is of the order of the width of the assembly formed by this sheet and by the shell 120.

Finally, although that part of the description and drawings which relates to the second embodiment only envisages the use where the conducting pathways 1* extend transversely of the long axis of the groove 102, these pathways could of course vary by being disposed parallel to such axis.

In this case, it will of course be the lateral faces of the module, now planar, which will have to be profiled, one of them like the end 111a, 111b of the plug 111, and the other like the end 110a of the casing 110 of the assembly, the other structural elements of such an assembly remaining unchanged.

In this variant it will be possible to locate a plurality of assemblies of the type described, in sequence in the groove 102, of the same length or different lengths, adapted to the nature and the particular requirements of such a module. Furthermore, in this variant, a single set of bus bars is enough for all the assemblies that have been introduced into the groove 102.

In a final variant, likewise not illustrated, the tabs 221 and 222 would not have to be produced by stamping the slider, but could consist of screw-threaded rods engaging with nuts fixed to the slider, the free end of which would come in contact with the shell 120 as the slider moves, as in the case of the tabs 221 and 222. This variant would allow of fine adjustment of the pressure placed on that shell, and thereby on the conductive pathways in contact with the bus bars of the system to which the assembly in question is to be connected, the pressure variation being obtainable by screwing the rods more or less tightly in the nuts.

To conclude, it may be observed that, thanks to the suggested design, in whatever variation, an assembly according to the invention can be placed in the groove without the need for much effort, and that, after such placement, the conductive pathways which it carries run no risk of being torn out, being tucked away inside the plug 111 of the assembly and being additionally protected by the slider in the position where it blocks the passage 114.

We claim:

1. Assembly including a modular electric circuit and a connector for electrically connecting the circuit to an autonomous electrical system, the assembly comprising a casing which contains both said circuit and the connector, and means for removably fixing the casing to the system in a position enabling the electrical connection between a first plurality of conductive pathways electrically connected to the points of the circuit to be connected to the system, and a second plurality of corresponding conductive pathways, belonging to the system, wherein the casing has a recess opening upon a portion of its lateral surface and thereon delimiting a window of essentially rectangular shape, whose position on the casing is such that, when the casing of the assembly is fixed to the system by a fixation means, the sides of said window enclose at least a portion of the length of said second plurality of conductive pathways, and wherein the first plurality of conductive pathways is carried by a substrate provided in the form of a flexible tongue, in insulating material, projecting into the recess, remote from the window, from a first face of this recess abutting on a first side of the window, in the direction of a second face of the recess abutting on a second side of said window, facing the first side, said first plurality of conductive pathways being carried by the surface of the tongue which is turned towards said window and extending upon the tongue from its origin to its free end, said assembly further comprising elastic means keeping the tongue in a tucked away position within the recess and restoring it to that position when it has been dislodged therefrom, and a push mechanism enables bending of the tongue, in opposition to said elastic means, so as to move the first plurality of conductive pathways into contact with the second plurality of corresponding pathways belonging to the system, and to maintain this contact at least in a first functioning position of the mechanism, the mechanism permitting the tongue to be given over to the sole action of said elastic means, at least in another functioning position.

2. Assembly according to claim 1, wherein said recess has a floor which is formed by one face of an intermediate wall separating this recess from a rectilinear slide track, said track having a longitudinal axis housed in the casing and of which at least a part of the floor is constituted by the other face of said wall, wherein this wall is traversed by a rectilinear slot, parallel to said first and second sides of said window and perpendicular to the longitudinal axis of the track, wherein the push mechanism is formed by at least one rectilinear bar of circular section, said bar being freely engaged in said slot said slot having a top and a bottom opening, and in contact, through said top opening, with said flexible tongue and, said bottom opening being disposed in a position essentially opposite to that of the top opening, said bar being in contact with the sole of a shoe mounted for sliding on said slide track, said sole presenting a plane profile over the greatest part of its surface and being additionally profiled in a portion of that surface adjacent to its plane part and through a width essentially corresponding to the length of said bar, in such a way as to delimit, together with said wall a clearance communicating with said slot at least in a first axial limiting position of the shoe, the maximum depth of this clearance, the thickness of said wall and the diameter of the bar being chosen such that, in this position of the shoe, the bar projects into the interior of the clearance under the action of said elastic means, to a height sufficient to ensure the maintenance of the tongue in a tucked-away position in the interior of the recess (11) of the casing, while, in a second axial limiting position of the shoe, opposite to said first position, said clearance is occupied by the shoe at least in the part directly exposed to said rectilinear slot, the sole of the shoe being thus in contact with said bar by its planar part and urging the bar to the interior of the slot so that the bar thus projects into the recess of the casing over a depth sufficient to cause the bending of the tongue so as to effect mutual contact of the conductive pathways belonging to the first plurality of said pathways and to the second plurality thereof.

3. Assembly according to claim 2, in which the casing is intended to be inserted in a corresponding housing located in said system and on the floor of which said second plurality of conductive pathways lies flush, said fixation means comprising at least one locking tongue, kinematically integral with said shoe, projecting entirely beyond the casing when the shoe is in the second axial limiting position and being tucked away inside the casing in the first limiting position of the shoe, this tongue being intended to penetrate into a corresponding recess of the system when it is brought into said projecting position, in such a way to ensure that the casing is secured to the system.

4. Assembly according to claim 3, wherein the casing has an opening located to the right of the shoe and giving access to said tongue, the latter being equipped with gripping means for the fingers of the user, making possible displacement of the shoe between its two limiting positions.

5. Assembly according to claim 1, wherein the casing has two rectilinear cutouts in the wall thereof opposite to that which presents said window, symmetrically disposed about the longitudinal axis of the casing, each cutout communicating with said recess, said recess having an upper and lower face, across said lower face of the recess, and wherein the push mechanism includes a sleeve enclosing the casing in the part thereof which presents said recess and mounted for sliding over rectilinear guide tracks belonging to the casing and oriented parallel to said longitudinal axis, this sleeve having at its end facing said cutouts two tabs of a width less than that of the cutouts and each located on the axis of a respective cutout, in the interior of said cutout for at least a part of its length, the assembly comprising abutment members being part of the casing and which limit the travel of the sleeve on the casing between two limiting positions, a first position in which said tabs hold said tongue in the bent position bringing the first plurality of conductive pathways into contact with the second plurality of pathways, and a second position in which the tongue is given over to the sole action of said elastic means, said contact being interrupted.

6. Assembly according to claim 5, wherein said abutment members comprise, on the one hand, a first arresting surface against which one portion of the sleeve situated opposite said tabs can abut, in the first limiting position of the sleeve, and, on the other hand, a second and a third abutment surface housed in the floor of said cutouts and disposed upon the locus followed by the end of these tabs when the sleeve is conducted into said second limiting position.

7. Assembly according to claim 1, wherein said elastic means comprises a leaf spring secured to the tongue on the face opposite to that which carries the first plurality of conductive pathways, said tongue fitting at one edge into said face of the recess, and being cut in the form of a comb, along its other edge, the teeth of the comb having a width and spacing corresponding to the width and spacing of said pathways, and the other edge extending in retraction to correspond to the free end of the tongue in such a way as to permit a bending of the latter sufficient to ensure correct electrical contact with the conductive pathways of the second plurality of pathways, in said first functioning position of the pushing mechanism.

* * * * *